(12) United States Patent
Chang et al.

(10) Patent No.: US 11,776,880 B2
(45) Date of Patent: *Oct. 3, 2023

(54) SURFACE TREATMENT METHOD AND APPARATUS FOR SEMICONDUCTOR PACKAGING

(71) Applicant: Taiwan Semiconductor Manufacturing Co., Ltd., Hsinchu (TW)

(72) Inventors: Chih-Horng Chang, Taipei (TW); Jie-Cheng Deng, New Taipei (TW); Tin-Hao Kuo, Hsinchu (TW); Ying-Yu Chen, Yilan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 353 days.

This patent is subject to a terminal disclaimer.

(21) Appl. No.: 17/073,937

(22) Filed: Oct. 19, 2020

(65) Prior Publication Data

US 2021/0050281 A1    Feb. 18, 2021

Related U.S. Application Data

(63) Continuation of application No. 16/717,136, filed on Dec. 17, 2019, now Pat. No. 10,811,338, which is a
(Continued)

(51) Int. Cl.
*H01L 23/48*      (2006.01)
*H01L 21/56*      (2006.01)
(Continued)

(52) U.S. Cl.
CPC ............ *H01L 23/48* (2013.01); *H01L 21/563* (2013.01); *H01L 23/3142* (2013.01);
(Continued)

(58) Field of Classification Search
CPC . H01L 23/48; H01L 23/3142; H01L 23/3128; H01L 21/561; H01L 21/563;
(Continued)

(56) References Cited

U.S. PATENT DOCUMENTS

| 4,902,551 A | 2/1990 | Nakaso et al. |
| 5,622,782 A | 4/1997 | Poutasse, III et al. |

(Continued)

FOREIGN PATENT DOCUMENTS

| CN | 101137768 A | 3/2008 |
| CN | 102237470 A | 11/2011 |

(Continued)

OTHER PUBLICATIONS

Lee, H.Y., et al., "Effects of Oxidation Treatments on the Fracture Toughness of Leadframe/Epoxy Interfaces", Materials Science & Engineering A277, 2000, 7 pages, South Korea.

(Continued)

*Primary Examiner* — Dale E Page
*Assistant Examiner* — Quovaunda Jefferson
(74) *Attorney, Agent, or Firm* — Slater Matsil, LLP

(57) ABSTRACT

A surface treatment and an apparatus for semiconductor packaging are provided. A surface of a conductive layer is treated to create a roughened surface. In one example, nanowires are formed on a surface of the conductive layer. In the case of a copper conductive layer, the nanowires may include a CuO layer. In another example, a complex compound is formed on a surface of the conductive layer. The complex compound may be formed using, for example, thiol and trimethyl phosphite.

20 Claims, 12 Drawing Sheets

Related U.S. Application Data continuation of application No. 13/895,099, filed on May 15, 2013, now Pat. No. 10,522,444.

(60) Provisional application No. 61/776,544, filed on Mar. 11, 2013.

(51) Int. Cl.
  *H01L 23/00* (2006.01)
  *H01L 23/31* (2006.01)

(52) U.S. Cl.
  CPC ............ *H01L 24/97* (2013.01); *H01L 21/561* (2013.01); *H01L 23/3128* (2013.01); *H01L 24/13* (2013.01); *H01L 24/16* (2013.01); *H01L 24/83* (2013.01); *H01L 2224/13101* (2013.01); *H01L 2224/16225* (2013.01); *H01L 2224/32225* (2013.01); *H01L 2224/73204* (2013.01); *H01L 2224/81815* (2013.01); *H01L 2224/83051* (2013.01); *H01L 2224/92125* (2013.01); *H01L 2224/97* (2013.01); *H01L 2924/01322* (2013.01); *H01L 2924/12042* (2013.01); *H01L 2924/15311* (2013.01); *H01L 2924/181* (2013.01); *H01L 2924/18301* (2013.01); *H01L 2924/351* (2013.01)

(58) Field of Classification Search
  CPC ..... H01L 24/13; H01L 24/16; H01L 24/8397; H01L 2224/13101; H01L 2224/16225; H01L 2224/32225; H01L 2224/73204; H01L 2224/81815; H01L 2224/83051; H01L 2224/92125; H01L 2224/97; H01L 2924/01322; H01L 2924/12042; H01L 2924/15311; H01L 2924/181; H01L 2924/18301; H01L 2924/351
  See application file for complete search history.

(56) References Cited

U.S. PATENT DOCUMENTS

| | | |
|---|---|---|
| 5,889,316 A | 3/1999 | Strobel et al. |
| 6,046,075 A | 4/2000 | Manteghi |
| 6,235,406 B1 | 5/2001 | Uzoh |
| 6,784,093 B1 | 8/2004 | Lu et al. |
| 6,995,476 B2 | 2/2006 | Hashimoto |
| 7,301,226 B2 | 11/2007 | Seki et al. |
| 10,522,444 B2 * | 12/2019 | Chang ................. H01L 23/3142 |
| 10,811,338 B2 * | 10/2020 | Chang ................... H01L 21/563 |
| 2004/0119166 A1 | 6/2004 | Sunohara |
| 2004/0203192 A1 | 10/2004 | Gracias |
| 2006/0019419 A1 | 1/2006 | Shin et al. |
| 2007/0157967 A1 | 7/2007 | Mershin et al. |
| 2007/0262432 A1 | 11/2007 | Otremba |
| 2008/0037929 A1 | 2/2008 | Kim et al. |
| 2008/0096046 A1 | 4/2008 | Yamashita et al. |
| 2008/0105286 A1 | 5/2008 | Kizawa et al. |
| 2008/0216921 A1 | 9/2008 | Kwan et al. |
| 2009/0258459 A1 * | 10/2009 | Gerber ................ H01L 21/4853 438/107 |
| 2011/0266586 A1 | 11/2011 | Shen et al. |
| 2011/0291152 A1 | 12/2011 | Liaw |
| 2013/0186547 A1 | 7/2013 | Fujino et al. |
| 2014/0252600 A1 | 9/2014 | Chang et al. |

FOREIGN PATENT DOCUMENTS

| | | | |
|---|---|---|---|
| JP | 02198196 A | * | 8/1990 |
| JP | 0713304 B2 | | 2/1995 |
| JP | 2656622 B2 | | 9/1997 |
| JP | 09246720 A | | 9/1997 |
| JP | 2000282265 A | | 9/2000 |

OTHER PUBLICATIONS

Wong, C. K. Y., et al., "Thiol Based Chemical Treatment as Adhesion Promoter for Cu-Epoxy Interface", International Conference on Electronic Packaging Technology & High Density Packaging, (ICEPT-HDP), 2008, 7 pages, Shanghai.

* cited by examiner

SURFACE TREATMENT METHOD AND APPARATUS FOR SEMICONDUCTOR PACKAGING

This application is a continuation of U.S. application Ser. No. 16/717,136, filed Dec. 17, 2019, entitled "Surface Treatment Method and Apparatus for Semiconductor Packaging," now U.S. Pat. No. 10,811,338, which is a continuation of U.S. application Ser. No. 13/895,099, filed May 15, 2013, now U.S. Pat. No. 10,522,444, issued on Dec. 31, 2019, entitled "Surface Treatment Method and Apparatus for Semiconductor Packaging," which claims the benefit of U.S. Provisional Application No. 61/776,544, filed Mar. 11, 2013, entitled "Surface Treatment Method and Apparatus for Semiconductor Packaging," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

One type of packaging for semiconductor devices is referred to as a bump on trace (BOT) package. Solder bumps are formed on dies of a semiconductor wafer, and the dies are singulated. Die or "flip chips" are attached or soldered to traces on the BOT packages using a solder reflow process. A molding underfill (MUF) may be dispensed into the gap between the semiconductor chip and the package component to reduce cracking in solder bumps or solder balls, wherein cracks are typically caused by thermal stresses. The package component may be an interposer that includes metal connections for routing electrical signals between opposite sides. The chip may be bonded to the interposer through direct metal bonding, solder bonding, or the like. In some situations, the dies are bonded to a larger substrate which may then be sawed into individual packages.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1:
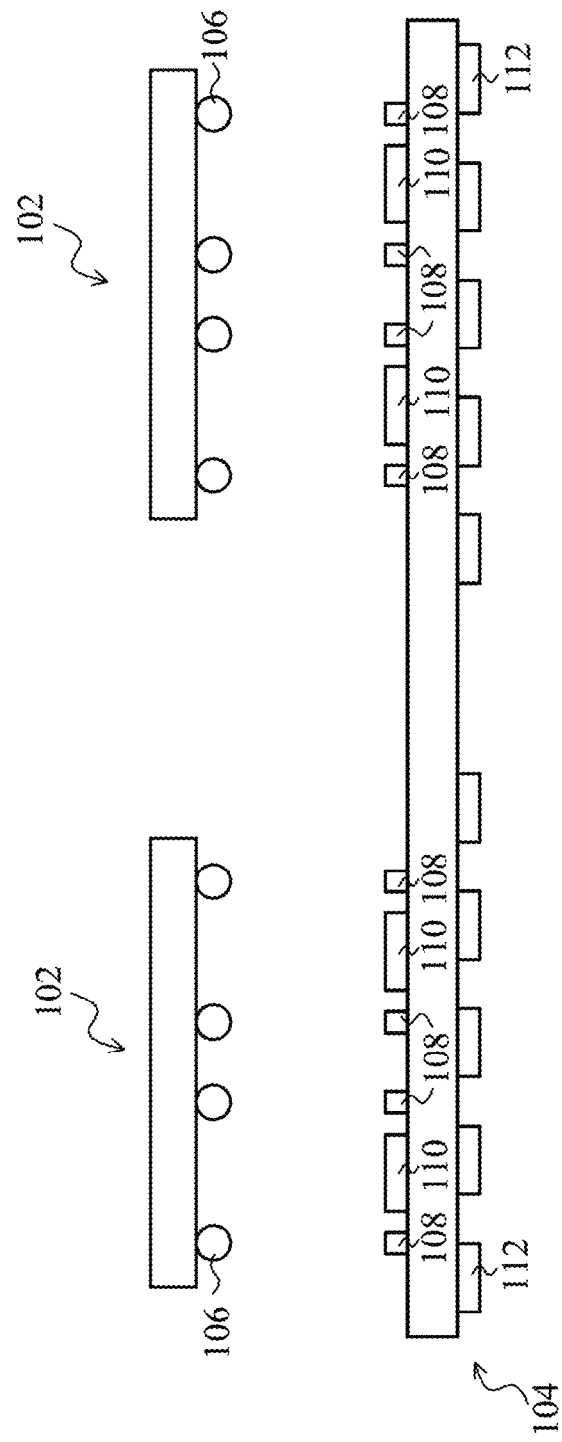
FIGS. 1-6 illustrate various intermediate steps of forming an embodiment.

Referring first to FIG. 1, there is shown a cross-section view of a plurality of integrated circuit dies 102 and a substrate 104 in accordance with an embodiment. The integrated circuit dies 102 may be any suitable integrated circuit die for a particular application. For example, the integrated circuit dies 102 may be a memory chip, such as a DRAM, SRAM, NVRAM, APU, and/or the like, a logic circuit, or the like. It should be noted that the integrated circuit dies 102 may be the same or different. For example, in an embodiment all of the integrated circuit dies 102 are the same, such as a memory chip. In another embodiment, the integrated circuit dies 102 may be different, such as one memory chip and one logic chip. Other configurations may also be used.

The integrated circuit dies 102 include conductive bumps 106 formed thereon, which may be formed of a eutectic solder, lead free solder, or the like. FIG. 1 illustrates the conductive bumps 106 are formed on the integrated circuit dies 102 for illustrative purposes. In other embodiments, the conductive bumps 106 may be formed on the substrate 104.

The substrate 104 may be any suitable substrate, such as a 1/2/1 laminate substrate, a 4-layer laminate substrate, interposer, packaging substrate, another die/wafer, a printed-circuit board, a high-density interconnect, or the like. The substrate 104 may include a first set of electrical connections 108 along a first side of the substrate 104 and a second set of electrical connections 112 along an opposing second side of the substrate 104. Through vias (TVs) (not shown) in the substrate 104 may be included to provide electrical connections between corresponding ones of the first set of electrical connections 108 and the second set of electrical connections 112, and hence between the integrated circuit dies 102 mounted on one side of the substrate 104 and the second set of electrical connections 112 on the opposing second side of the substrate 104. The substrate 104 may further include one or more redistribution lines (RDLs) to allow for a different pin configuration and/or larger electrical connections.

In an embodiment, the integrated circuit dies 102 are to be bonded to the substrate 104 using bump-on-trace (BOT) technology. Generally, BOT technology utilizes conductive bumps, e.g., metal or solder bumps, bonded directly onto narrow metal traces formed on another substrate, such as a package substrate, interposer, or the like, rather than bonded onto metal pads that have greater widths than the respective connecting metal traces. The BOT structures require smaller chip areas, and the manufacturing cost of the BOT structures is low. In this embodiment, the first set of electrical connections 108 may comprise traces formed on the substrate 104, wherein the conductive bumps 106 will be bonded to the corresponding first set of electrical connections 108 as discussed in greater detail below with reference to FIG. 2.

The substrate 104 may further include a conductive layer 110, such as a copper foil. The conductive layer 110 may function as, for example, a ground shield. It should also be noted that the figures contained herein have been simplified for illustrative purposes. For example, the conductive bumps 106 on the integrated circuit dies 102 may include an under bump metallization (UBM) structure, a pillar structure, or other structures. As another example, various passivation layers, polymer layers, or the like may also be included.

Figure 2:
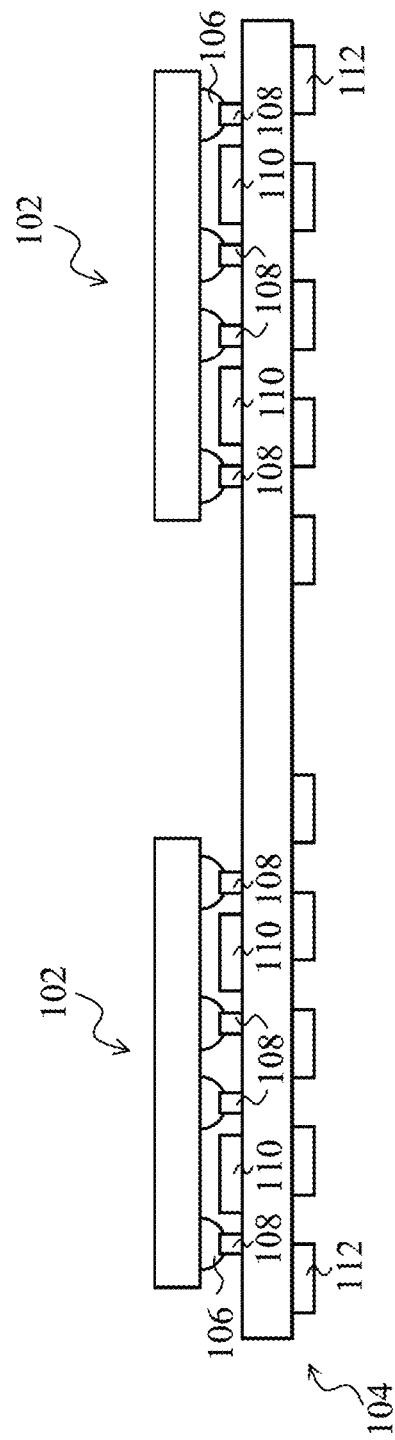

FIG. 2 illustrates the integrated circuit dies 102 and the substrate 104 after a bonding process in accordance with an embodiment. The integrated circuit dies 102 (two being shown in FIG. 2) are aligned and placed into contact with the substrate 104. After alignment and placement, a bonding process is performed to bond the conductive bumps 106 onto corresponding ones of the first set of electrical connections 108. The bonding process may comprise a thermal reflow process wherein the conductive bumps 106 are heated to melt the material on the conductive bumps 106, thereby causing the conductive bumps to bond to corresponding ones of the first set of electrical connections 108.

Figure 3:
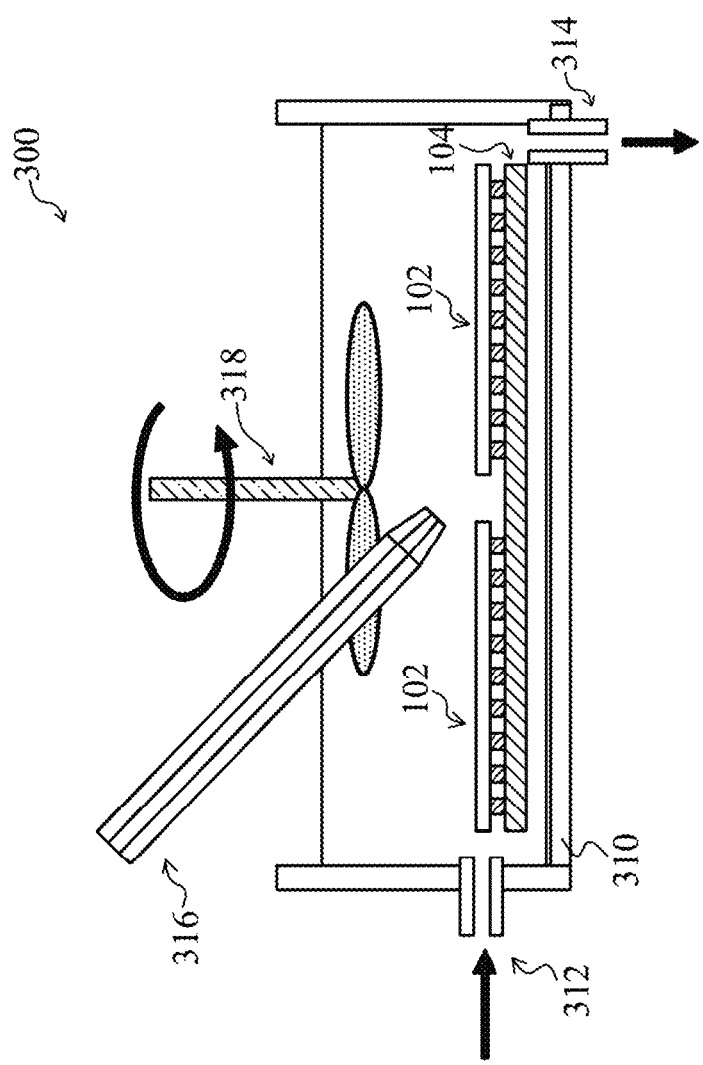

FIG. 3 illustrates a pre-fill process in accordance with an embodiment. The pre-fill process may comprise a soak process in a chemical solution using a chemical bath 300 such as that illustrated in FIG. 3. The chemical bath 300 includes a heated bottom plate 310. A jetting input 312 provides an input for the chemical solution and a jetting output 314 provides an output for the chemical solution. Additionally, a jetting nozzle 316 and/or a propeller 318 may be provided to further stir and circulate the chemical solution. The integrated circuit dies 102 and the substrate 104 may be placed into the chemical bath at a slope angle.

The space between the integrated circuit dies 102 and the substrate 104 may be quite small, particularly when using BOT techniques. In these types of embodiments, circulating the liquid may aid in forcing liquid between the integrated circuit dies 102 and the substrate 104. As such, using one or more of the jetting inlet 312/jetting outlet 314, the jetting nozzle 316, and the propeller 318 may be advantageous to treat the surfaces between the integrated circuit dies 102 and the substrate 104.

In an embodiment, the chemical soak may comprise a soak in 37.5 g $NaClO_2$, 10 g NaOH, 100 g $Na_3PO_4*12H_2O$, and 1 liter of $H_2O$. The concentration of such chemical may be between 0.5 mole and 1.5 moles. This solution may be heated to a temperature from about 85° C. to about 95° C. The integrated circuit dies 102 and the substrate 104 may be soaked in this solution for about 20 minutes. Thereafter, the integrated circuit dies 102 and the substrate 104 may be rinsed in deionized water and dried with air heated to a temperature of about 60° C. to about 90° C. Room temperature air may also be used for drying.

Figure 7A:
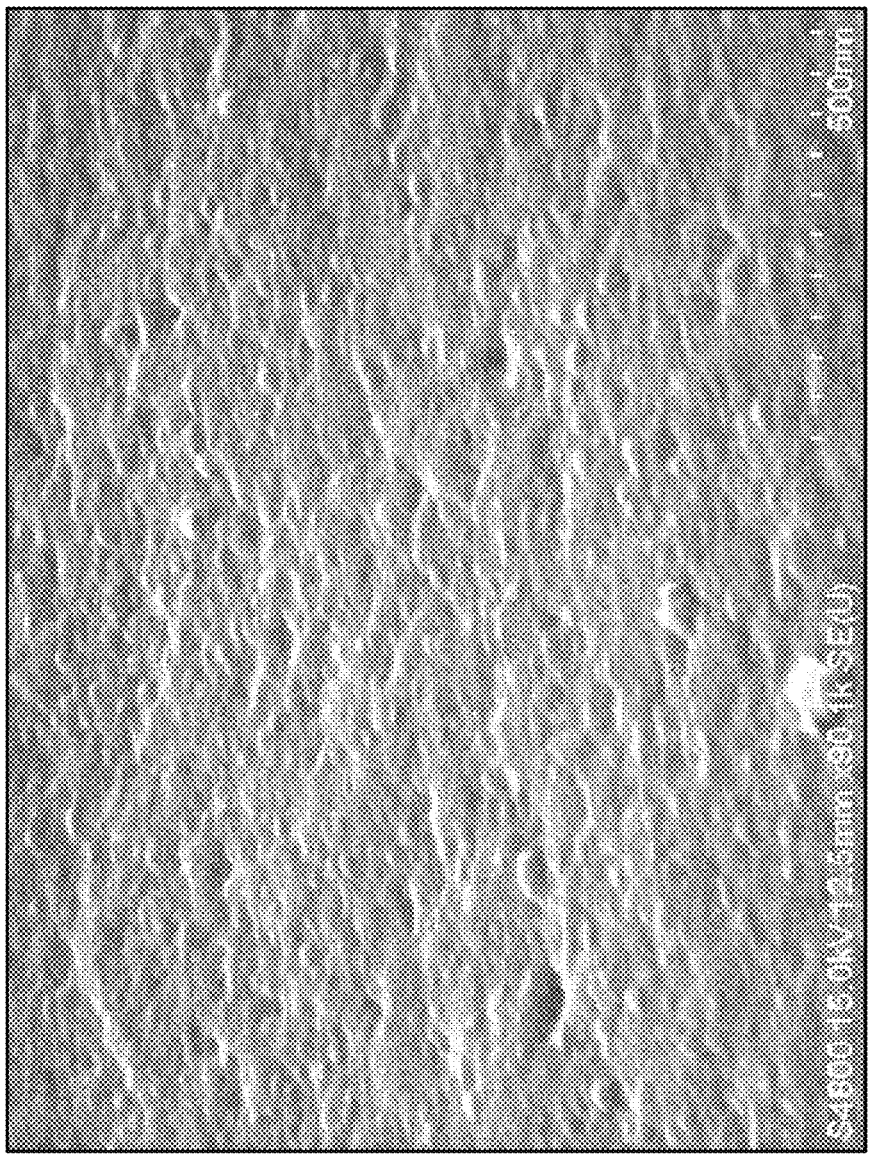
FIGS. 7A-7C illustrate a chemical treatment to a surface in accordance with an embodiment.
Figure 7B:
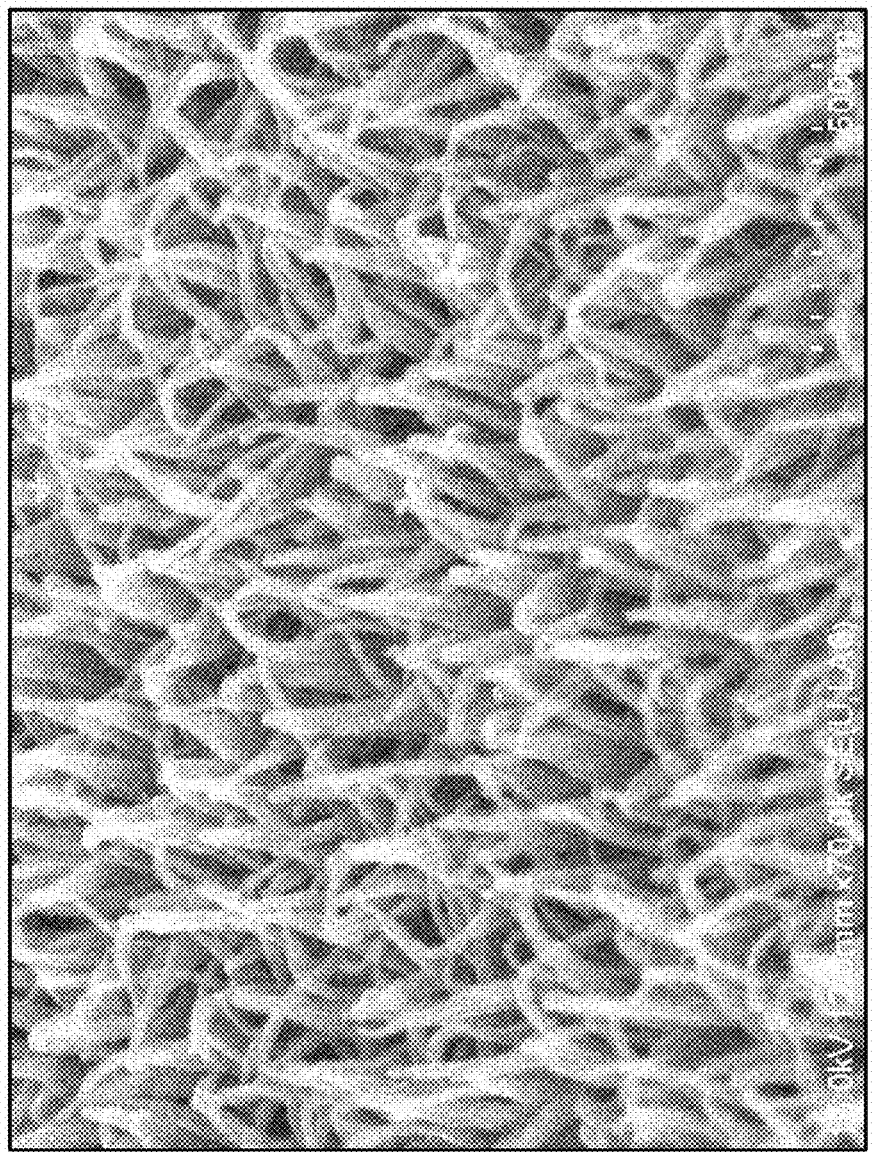

It is believed that a chemical treatment such as that described above creates a uniform and roughened surface on the traces. For example, in an embodiment in which the conductive layer 110 and the first set of electrical connections 108 comprises a Cu plating surface, which may have an optional naturally occurring $Cu_2O$ layer formed thereon, a chemical treatment such as that described above creates a CuO layer over the $Cu_2O$ layer. The CuO layer exhibits a roughened surface, resembling a grass-like surface. FIG. 7A is a micrograph of a Cu plating surface prior to performing the roughening treatment, and FIG. 7B is a micrograph of the Cu plating surface after performing the roughening treatment. As shown in FIG. 7A, the Cu plating surface prior to the roughening treatment exhibits a relatively flat surface with little dimension normal to the major surface. After the roughening treatment, the surface exhibits a grass-like surface.

Figure 7C:
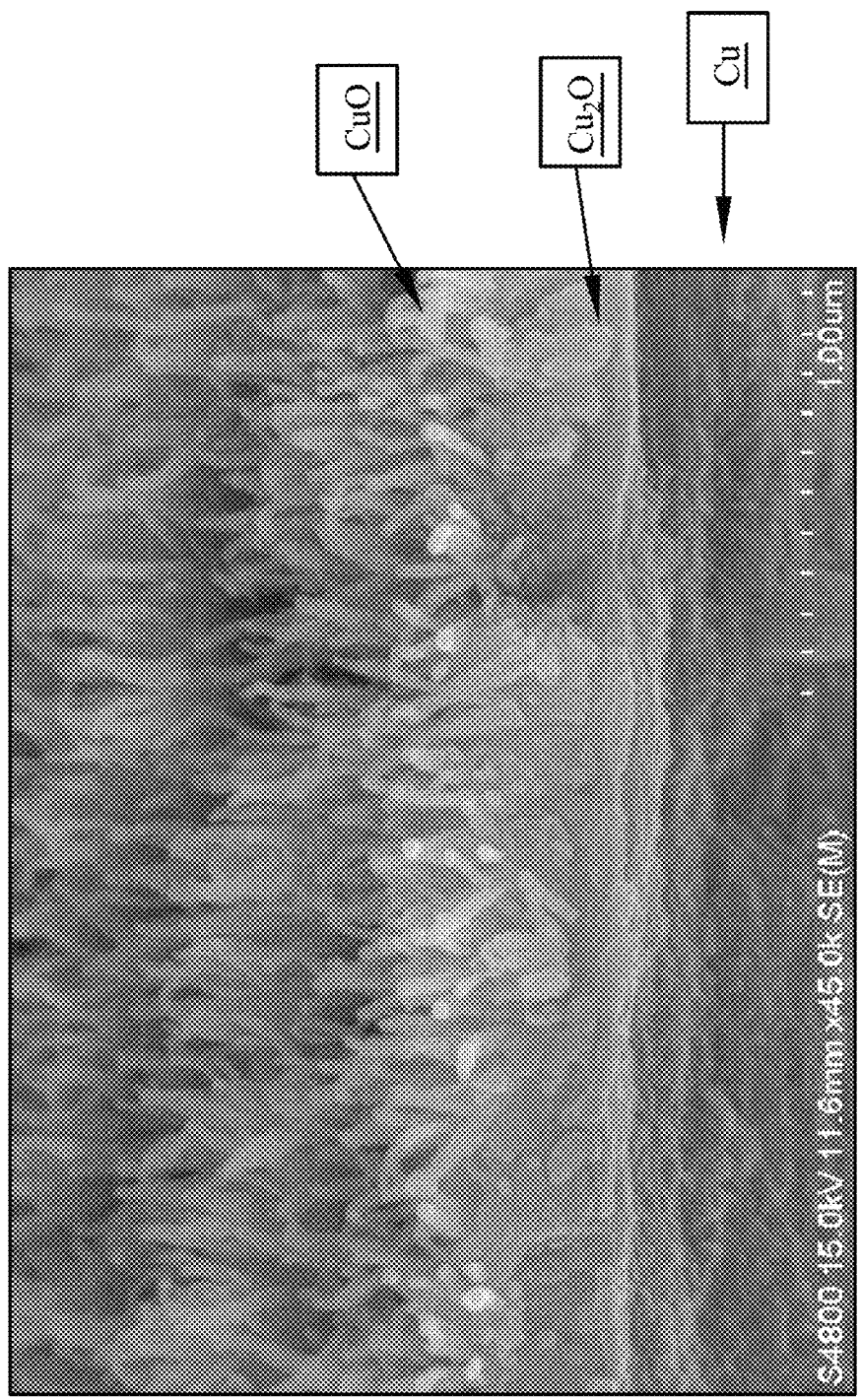

This is illustrated by the energy dispersive spectrometer (EDS) analysis illustrated in FIG. 7C. The optional $Cu_2O$ layer having an overlying CuO layer formed as a result of the above process. The CuO layer forms a layer of nanowires or a grassplot-like surface over the $Cu_2O$ layer. This type of surface may increase the mechanical interlocking force between the Cu surface and an overlying material, such as a MUF as described below with reference to FIG. 4.

In an embodiment, the grassplot-like surface of the nanowires may exhibit a pitch less than about 500 nm, an average roughness RA of about 50 nm to about 70 nm, and a height from about 30 nm to about 140 nm. For example, in an embodiment, the average roughness RA is greater than 50 nm, the height is longer than about 120 nm, and the pitch is less than about 500 nm. It has been found that nanowires of these dimensions provide good bonding characteristics between the conductive layer 110 and the subsequently formed MUF for most typical semiconductor applications for the consumer environment. Other pitches and average roughness, however, may be used in accordance with a particular application and/or material. For example, different materials for the traces (such as gold, aluminum, and the like) and different materials for the MUF may allow different pitches and average roughness. It should be noted that the dimensions should be such that the surface provides sufficient mechanical interlocking characteristics to sufficiently reduce delamination for the given environment and materials, thereby providing product with the required reliability for a particular application and environment.

The roughness/profile of chemically treated Cu can affect the mechanical interlocking force, or adhesion strength. The adhesion strength is dependent upon the surface roughness; high roughness provides relatively high adhesion strength, and low roughness provides relatively low adhesion strength. The pitch of the roughness may also affect the adhesion strength. High roughness and small pitch may not exhibit good mechanical properties or high adhesion strength. For example, the profile of high roughness and small pitch of Cu surface usually exhibits deep and narrow canyons, such that the molding compound (or MUF) may not fully fill these canyons. In these cases, the bottom of the CuO canyons may be empty and the effective roughness may be lower than the surface roughness. Furthermore, long CuO crystals may be brittle, the empty bottom of such CuO canyons are sensitive to dropping or impact damage. The large pitch between two CuO crystals reduces the interlocking force, while small pitch may lead to deep canyon problems. In an embodiment, the pitch of the CuO crystals is 100 nm to about 500 nm, and the CuO crystals have a length less than about 180 nm. The pitch and length of CuO crystals may also be adjusted based on the chemical composition and filler size of the MUF.

Additionally, the coefficients of thermal expansion (CTEs) mismatches between different materials in a package are the main source of stress for the package, wherein a relatively large CTE mismatch or large temperature variations can induce stress between the various components of the package. In these situations, a higher adhesion force at MUF/Cu interface may be desirable to prevent or reduce delamination or cracking. Modifying the Cu (or other type of material) surface roughness can provide increased mechanical adhesion force. It should be noted, the size of the grassplot-like surface may be adjusted to increase the mechanical interlocking force. If the size of the grassplot-like surface is increased too much, the mechanical interlocking force may decrease. For example, MUF may not fully fill into the tiny gaps if the pitch between the CuO crystal nanowires, possibly reducing the mechanical interlocking force. Additionally, long CuO crystal nanowires may become brittle and break if the nanowires become too long or large. One of ordinary skill in the art will realize that the length and pitch may be adjusted to provide sufficient mechanical strength for a particular application. The amount of surface roughness, e.g., the size and/or pitch of the nanowires, may also be dependent upon the type of material.

The following table illustrates the results of an X-ray photoelectron spectrometer (XPS) analysis of the surface before and after the above process. As illustrated in the table, the ratio of CuO and $Cu(OH)_2+CuCO_3$ increases in the treated sample.

| XPS analysis Chemical Composition Ratio, at. % | | |
| --- | --- | --- |
| | Natural Cu Oxide | Chemical Treated Cu |
| $Cu + Cu_2O$ | 74.1 | 12.7 |
| $Cu(OH)_2 + CuCO_3$ | 13.3 | 65.3 |
| CuO | 12.6 | 22 |

In another embodiment, the integrated circuit dies 102 and the substrate 104 may be soaked in a complex compound, such as thiol ($C_6H_7NS$), trimethyl phosphite ($C_3H_9O_3P$), or the like. For example, in an embodiment in which the conductive layer 110 and the first set of electrical connections 108 comprises Cu, having a naturally occurring $Cu_2O$ formed thereon, soaking in a complex compound such as thiol or trimethyl phosphite provides a complex compound layer, which may act as an adhesion layer that may provide chemical bonding, such as dipolar bonding forces.

As an example, the pre-fill process may comprise soaking the integrated circuit dies 102 and the substrate 104 in one molarity of thiol at room temperature for about 5 hours to about 10 hours. After soaking, the integrated circuit dies 102 and the substrate 104 may be rinsed in ethanol and dried using compressed air at room temperature. The following table illustrates the results of an XPS analysis of the surface before and after this above process.

| XPS analysis Chemical Composition Ratio, at. % | | |
| --- | --- | --- |
| | Natural Cu Oxide | Thiol treatment |
| C | 39.6 | 66.8 |
| Cu | 32.4 | 8.5 |
| N | 2.8 | 8.2 |
| O | 25.1 | 7.2 |
| P | <0.1 | <0.1 |
| S | <0.1 | 9.2 |

Figures 8A, 8B:
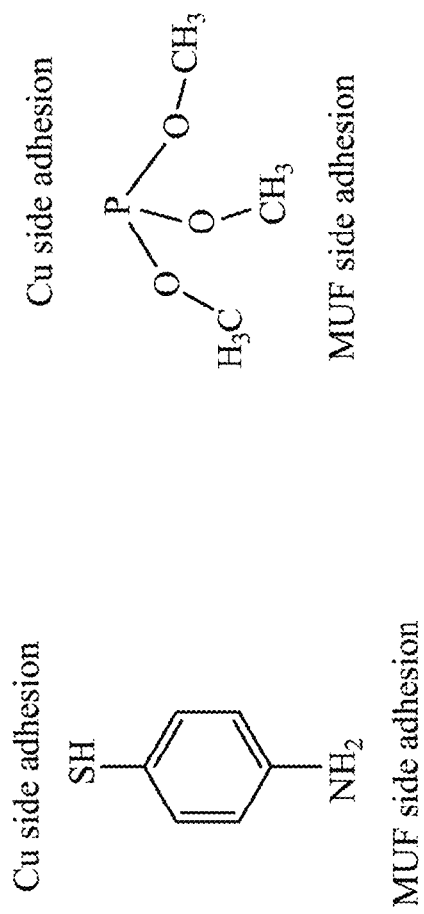
FIGS. 8A-8B illustrate bonding interfaces using complex compounds in accordance with embodiments.
Figure 9:
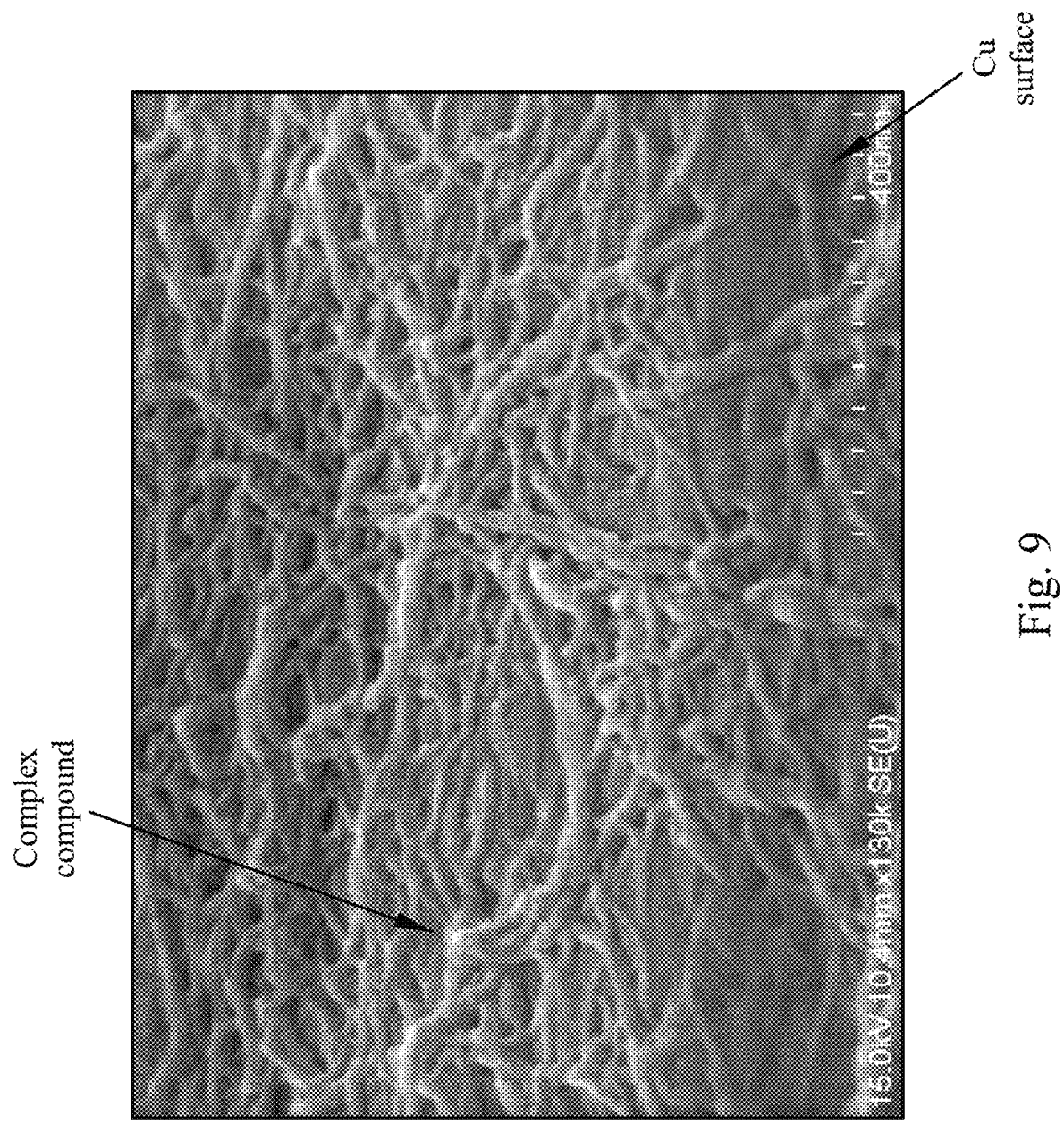
FIG. 9 illustrates a complex compound on a conductive layer.

The bonding interface between the Cu material of the conductive layer 110 on the substrate 104 and the subsequently formed molding compound is illustrated in FIG. 8A. FIG. 8B illustrates the bonding interface between the Cu material of the conductive layer 110 on the substrate 104 and the subsequently formed molding compound in an embodiment using trimethyl phosphite as the complex compound. FIG. 9 provides a micrograph of the complex compound formed over a copper surface.

Figure 4:
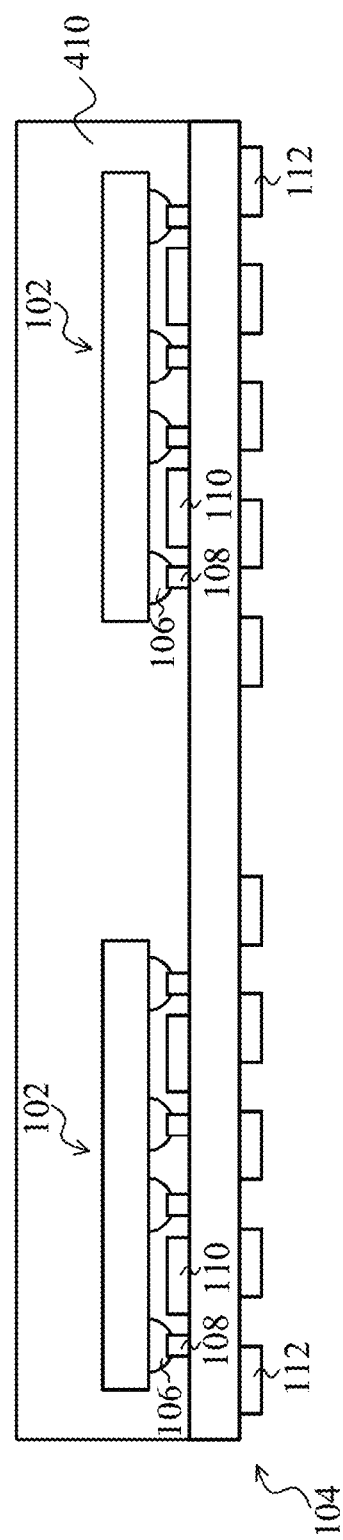

FIG. 4 illustrates a MUF 410 applied over and under the integrated circuit dies 102 in accordance with an embodiment. The MUF 410 may be injected or otherwise formed in the space between and over the integrated circuit dies 102 and the substrate 104. The MUF 410 may, for example, comprise a liquid epoxy, deformable gel, silicon rubber, or the like, that is dispensed between the integrated circuit dies 102 and the substrate 104, and then cured to harden. This MUF 410 is used, among other things, to reduce cracking in the conductive bumps 320 and to protect the joints from contaminants.

It has been found that a treatment such as those described above with reference to FIG. 3 improves the bonding between exposed portions of the conductive layer 110 and the MUF 410, thereby reducing delamination. For example, experimental results indicated that processes such as those described herein may increase the strength of the bond by a factor of two as compared to the untreated surfaces at time zero and post Highly Accelerated Temperature and Humidity Stress Test (HAST) as defined by JEDEC JESD-22-A110 Revision D. These processes may also allow a greater wait time before applying the MUF 410.

Figure 5:
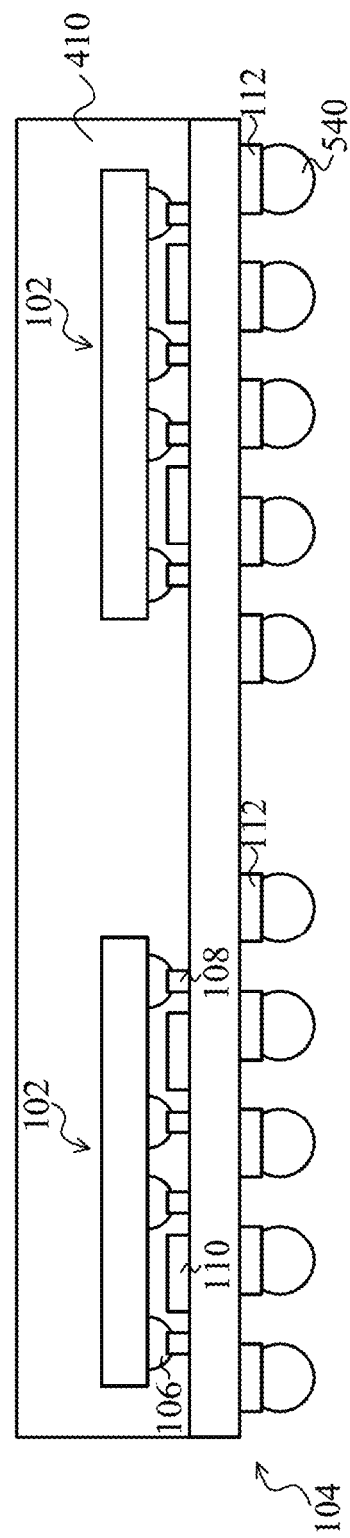

FIG. 5 illustrates the integrated circuit dies 102 and the substrate 104 after a second set of electrical connections 540 have been mounted to the substrate 104 in accordance with an embodiment. In an embodiment, the second set of electrical connections 540 may comprise balls mounted in a Ball-Grid Array (BGA) arrangement and may be formed of a eutectic solder, lead free solder, or the like. A cleaning process, such as a wet dip in a chemical solution of phosphoric acid ($H_3PO_4$) and hydrogen peroxide ($H_2O_2$), referred to as DPP, with 1% hydrofluoric (HF) acid, or another cleaning process, may be performed to remove contaminants from the surface prior to placing the second set of electrical connections 540 on the substrate 104.

The substrate 104 may further include other features. For example, the second side of the substrate may further include a backside redistribution layer, contact pads, under bump metallurgy, passivation layers, and/or the like.

Figure 6:
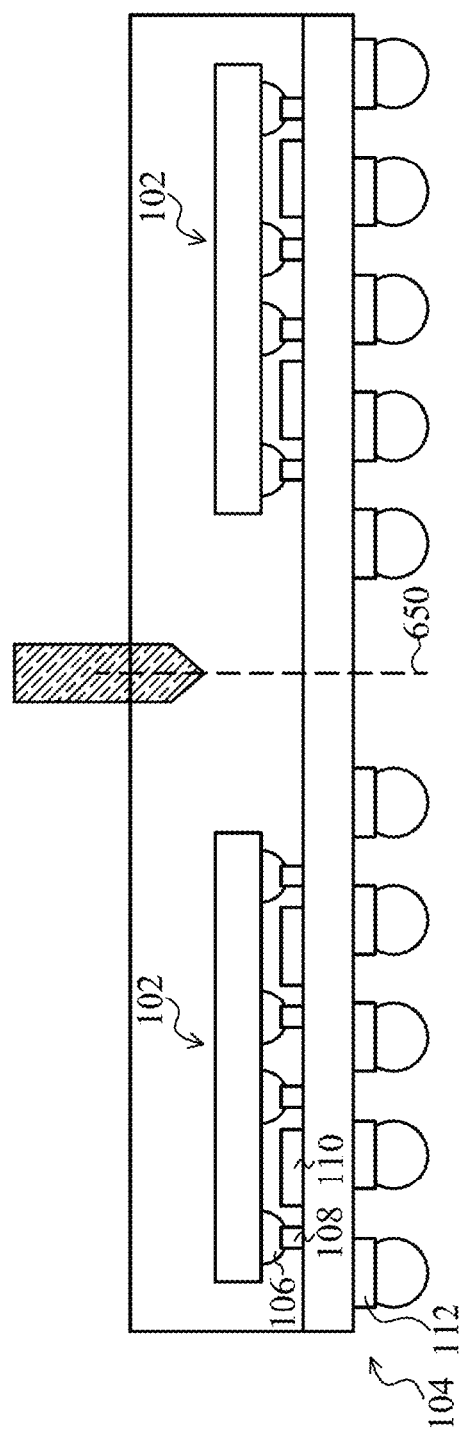

FIG. 6 illustrates a singulation process in accordance with an embodiment. For example, the substrate 104 may be singulated using a die saw, laser, or other mechanism to separate the integrated circuit dies 102 along scribe lines 650, thereby creating separate packages. FIG. 6 illustrates single integrated circuit dies 102 in each package for illustrative purposes. In other embodiments, a plurality of integrated circuit dies 102 may be included within each package after singulation. The separate packages may then be coupled to a printed circuit board (PCB), to another packaged integrated circuit, an interposer, to an electrical or mechanical module, or other devices using the second set of electrical connections 540.

Figure 10:
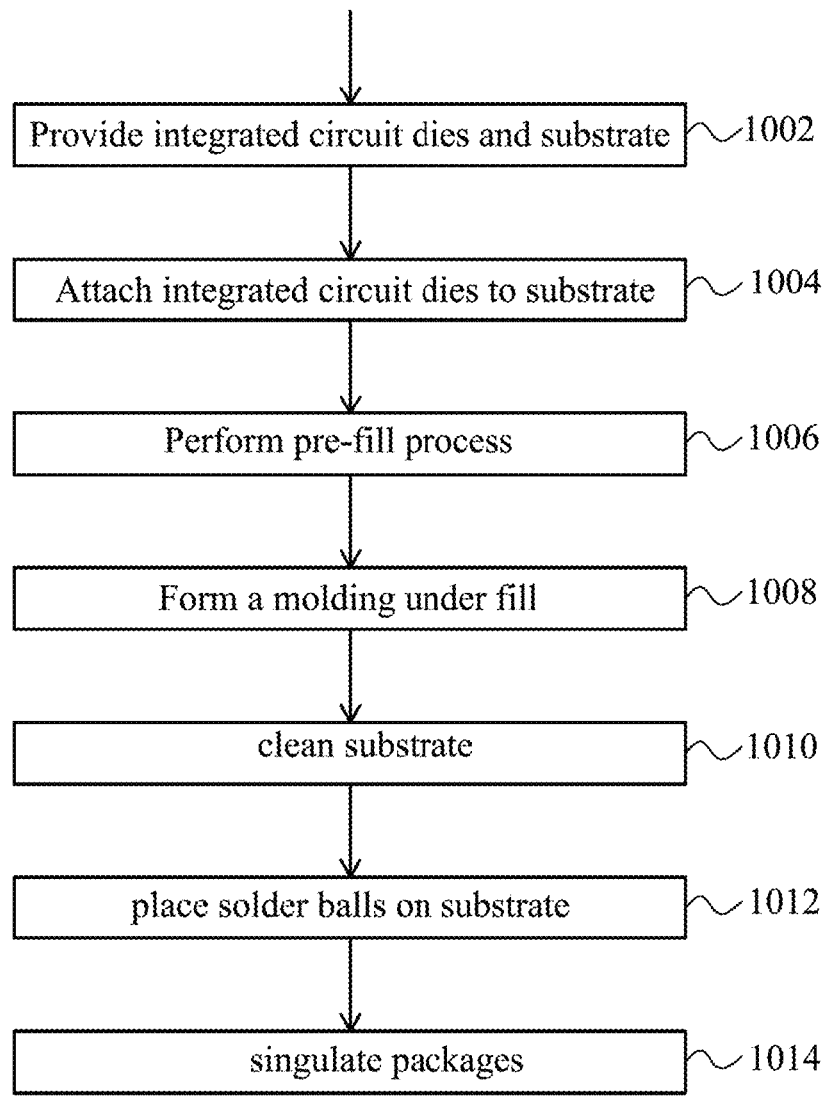
FIG. 10 is a flowchart illustrating a method of forming an embodiment.

FIG. 10 illustrates a method of forming a package in accordance with an embodiment. The process begins in step 1002 wherein an integrated circuit die and a substrate are provided, such as that discussed above with reference to FIG. 1. Next, in step 1004, one or more integrated circuit dies are attached to the substrate, such as that discussed above with reference to FIG. 2. In step 1006, a pre-fill process is performed, such as the processes described above with reference to FIG. 3. A molding underfill is placed between the integrated circuit dies and the substrate, and over the integrated circuit dies, in step 1008, such as that described above with reference to FIG. 5. The substrate may be cleaned in step 1010 as described above with reference to FIG. 6, and electrical connections, such as solder balls, may be placed on the substrate as described above with reference to FIG. 7 in step 1012. Thereafter, a singulation process may be performed as described above with reference to FIG. 8 in step 1014.

In an embodiment, a method of forming a semiconductor device is provided. The method includes providing a substrate having an integrated circuit die attached thereto and having a metal layer formed thereon. Exposed surfaces of the metal layer are treated to create a rough surface. Thereafter, a molding compound is applied over the metal layer.

In another embodiment, a semiconductor device is provided. The semiconductor device includes a substrate and a metal layer on the substrate. An oxide layer is on the metal layer, the oxide layer having nanowires extending from a surface of the oxide layer.

In yet another embodiment, a semiconductor device is provided. The semiconductor device includes a substrate with a metal layer on the substrate. A complex compound layer is on the metal layer.

In yet another embodiment, a method includes forming a conductive layer over a substrate. An integrated circuit die is bonded to the substrate. The conductive layer is disposed between the substrate and the integrated circuit die. After bonding the integrated circuit die to the substrate, the substrate with the integrated circuit die is submerged into a chemical solution. The chemical solution roughens a surface of the conductive layer to form a roughened surface. The roughened surface faces a bottom surface of the integrated circuit die. The roughened surface comprises nanowires.

In yet another embodiment, a method includes forming a conductive layer over a substrate. The conductive layer has a first amount of sulfur and a first amount of nitrogen. An integrated circuit die is bonded to the substrate. The conductive layer is disposed between the substrate and the integrated circuit die. After bonding the integrated circuit die to the substrate, the substrate with the integrated circuit die is submerged into a chemical solution. The chemical solution forms a complex compound layer on the conductive layer. The complex compound layer has a second amount of sulfur and a second amount of nitrogen. The second amount of sulfur is greater than the first amount of sulfur. The second amount of nitrogen is greater than the first amount of nitrogen.

In yet another embodiment, a device includes a substrate, a conductive layer on the substrate, and an integrated circuit die bonded to the substrate. A surface of the conductive layer includes nanowires. The nanowires include Cu, $CuO_2$, CuO, $Cu(OH)_2$ and $CuCO_3$. An amount of CuO in the nanowires is greater than an amount of $CuO_2$ in the nanowires. The amount of CuO in the nanowires is greater than an amount of Cu in the nanowires. A combined amount of $Cu(OH)_2$ and $CuCO_3$ in the nanowires is greater than the amount of CuO in the nanowires. The conductive layer is interposed between the integrated circuit die and the substrate.

In yet another embodiment, a device includes a substrate and a conductive layer on the substrate. The surface of the conductive layer includes nanowires. The nanowires include Cu, $CuO_2$, CuO, $Cu(OH)_2$ and $CuCO_3$. An amount of CuO in the nanowires is greater than an amount of $CuO_2$ in the nanowires. The amount of CuO in the nanowires is greater than an amount of Cu in the nanowires. A combined amount of $Cu(OH)_2$ and $CuCO_3$ in the nanowires is greater than the amount of CuO in the nanowires.

In yet another embodiment, a device includes a substrate, a conductive layer on the substrate, and a complex compound layer formed on the conductive layer. The complex compound layer covers an entirety of a top surface of the conductive layer. The conductive layer has a first amount of sulfur and a first amount of nitrogen. The complex compound layer has a second amount of sulfur and a second amount of nitrogen. The second amount of sulfur is greater than the first amount of sulfur. The second amount of nitrogen is greater than the first amount of nitrogen.

In yet another embodiment, a method includes forming a first conductive layer and a second conductive layer over a substrate. An integrated circuit die is attached to the first conductive layer. The second conductive layer is disposed between the substrate and the integrated circuit die. After attaching the integrated circuit die to the first conductive layer, the substrate with the integrated circuit die is submerged into a chemical solution. The chemical solution roughens a surface of the second conductive layer to form a roughened surface. The roughened surface faces a bottom surface of the integrated circuit die, the roughened surface comprising nanowires.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a substrate; and
   a conductive layer on the substrate, a surface of the conductive layer comprising nanowires, the nanowires comprising Cu, $CuO_2$, CuO, $Cu(OH)_2$ and $CuCO_3$, wherein an amount of CuO in the nanowires is greater than an amount of $CuO_2$ in the nanowires, wherein the amount of CuO in the nanowires is greater than an amount of Cu in the nanowires, and wherein a combined amount of $Cu(OH)_2$ and $CuCO_3$ in the nanowires is greater than the amount of CuO in the nanowires.

2. The device of claim 1, further comprising an integrated circuit die attached to the substrate, the conductive layer being interposed between the integrated circuit die and the substrate.

3. The device of claim 2, further comprising a molding compound extending along a top surface, a bottom surface, and sidewalls of the integrated circuit die, wherein the molding compound is in physical contact with the nanowires.

4. The device of claim 3, further comprising an electrical connection on the substrate, wherein the integrated circuit die is boned to the electrical connection using a conductive bump.

5. The device of claim 4, wherein the conductive layer and the electrical connection comprises copper.

6. The device of claim 4, wherein the molding compound is in physical contact with the electrical connection and the conductive bump.

7. The device of claim 1, wherein the conductive layer is configured as a ground shield.

8. A device comprising:
   a substrate;
   a conductive layer on the substrate; and
   a complex compound layer formed on the conductive layer, the complex compound layer covering an entirety of a top surface of the conductive layer, the conductive layer having a first amount of sulfur and a first amount of nitrogen, the complex compound layer having a second amount of sulfur and a second amount of nitrogen, the second amount of sulfur being greater than the first amount of sulfur, the second amount of nitrogen being greater than the first amount of nitrogen.

9. The device of claim 8, further comprising a molding compound in physical contact with the complex compound layer, the complex compound layer being covered by the molding compound.

10. The device of claim 9, wherein the complex compound layer acts as an adhesion layer between the conductive layer and the molding compound.

11. The device of claim 9, further comprising an integrated circuit die embedded in the molding compound, the integrated circuit die being electrically coupled to the substrate.

12. The device of claim 11, wherein the conductive layer is interposed between the integrated circuit die and the substrate.

13. The device of claim 8, wherein the complex compound layer comprises a greater amount of carbon than the conductive layer.

14. The device of claim 8, wherein the complex compound layer comprises thiol or trimethyl phosphite.

15. A method comprising:
forming a first conductive layer and a second conductive layer over a substrate;
attaching an integrated circuit die to the first conductive layer, the second conductive layer being disposed between the substrate and the integrated circuit die; and
after attaching the integrated circuit die to the first conductive layer, submerging the substrate with the integrated circuit die into a chemical solution, the chemical solution roughening a surface of the second conductive layer to form a roughened surface, the roughened surface facing a bottom surface of the integrated circuit die, the roughened surface comprising nanowires.

16. The method of claim 15, wherein the first conductive layer and the second conductive layer comprise a same conductive material.

17. The method of claim 15, wherein the chemical solution comprises $NaClO_2$, $NaOH$, $Na_3PO_4*12\ H_2O$, and $H_2O$.

18. The method of claim 15, further comprising forming a molding compound over the substrate and the integrated circuit die, wherein a portion of the molding compound is in physical contact with the roughened surface of the second conductive layer and the bottom surface of the integrated circuit die.

19. The method of claim 15, further comprising, after submerging the substrate with the integrated circuit die into the chemical solution, rinsing the substrate with the integrated circuit die in deionized water.

20. The method of claim 19, further comprising drying the substrate with the integrated circuit die with air heated to a temperature of about 60° C. to about 90° C.

* * * * *